(12) United States Patent
Butzmann

(10) Patent No.: US 9,831,690 B2
(45) Date of Patent: Nov. 28, 2017

(54) METHOD AND DEVICE FOR BALANCING ELECTRICAL VOLTAGES IN ELECTRICAL ACCUMULATOR UNITS

(75) Inventor: Stefan Butzmann, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 464 days.

(21) Appl. No.: 13/261,285

(22) PCT Filed: Nov. 19, 2009

(86) PCT No.: PCT/EP2009/065469

§ 371 (c)(1),
(2), (4) Date: May 29, 2012

(87) PCT Pub. No.: WO2011/060818

PCT Pub. Date: May 26, 2011

(65) Prior Publication Data

US 2012/0223669 A1    Sep. 6, 2012

(51) Int. Cl.

| | | |
|---|---|---|
| *H02J 7/00* | (2006.01) | |
| *B60L 11/18* | (2006.01) | |
| *H01M 10/42* | (2006.01) | |
| *G01R 31/36* | (2006.01) | |

(52) U.S. Cl.
CPC .......... *H02J 7/0016* (2013.01); *H02J 7/0014* (2013.01); *B60L 11/1866* (2013.01); *G01R 31/3658* (2013.01); *H02J 7/0018* (2013.01); *Y02T 10/7055* (2013.01)

(58) Field of Classification Search
CPC .............................. H02J 7/0014; H02J 7/0054

USPC ........................................................... 320/107
See application file for complete search history.

(56) References Cited

U.S. PATENT DOCUMENTS

| | | | | |
|---|---|---|---|---|
| 5,631,534 | A * | 5/1997 | Lewis ........................... | 320/103 |
| 5,821,729 | A * | 10/1998 | Schmidt et al. .............. | 320/126 |
| 6,150,795 | A * | 11/2000 | Kutkut et al. ................. | 320/118 |
| 6,222,344 | B1 * | 4/2001 | Peterson et al. ............. | 320/119 |
| 8,008,890 | B2 * | 8/2011 | Lee et al. ...................... | 320/118 |
| 8,692,515 | B2 * | 4/2014 | Nakao et al. ................. | 320/116 |
| 2004/0135544 | A1 * | 7/2004 | King ...................... | B60L 11/185 |
| | | | | 320/116 |
| 2004/0222771 | A1 | 11/2004 | Iwata et al. | |
| 2005/0029987 | A1 | 2/2005 | Lin et al. | |
| 2005/0077879 | A1 * | 4/2005 | Near ...................... | H02J 7/0018 |
| | | | | 320/166 |
| 2005/0140335 | A1 * | 6/2005 | Lee et al. ...................... | 320/118 |

(Continued)

FOREIGN PATENT DOCUMENTS

| | | |
|---|---|---|
| CA | 2231260 A1 | 9/1999 |
| FR | 2860353 A1 | 4/2005 |

(Continued)

*Primary Examiner* — Samuel Berhanu
*Assistant Examiner* — Tarikh Rankine
(74) *Attorney, Agent, or Firm* — Maginot, Moore & Beck LLP

(57) ABSTRACT

The invention provides a method for balancing the electrical voltages of at least two electrical accumulator units that are connected in series. According to the invention, one accumulator unit is connected to the winding of a coil in order to excite the coil, and the other accumulator unit is charged by the excited coil by the subsequent connection of the winding to the other accumulator unit. In addition, the invention provides a corresponding electrical accumulator.

4 Claims, 3 Drawing Sheets

(56) References Cited

U.S. PATENT DOCUMENTS

2006/0055367 A1    3/2006  Iwata et al.
2006/0119319 A1*   6/2006  Sakurai et al. ............... 320/116

FOREIGN PATENT DOCUMENTS

| JP | 07322516 A | * | 12/1995 | | |
|----|------------|---|---------|---|---|
| JP | 10-257683 A | | 9/1998 | | |
| JP | 2003-513605 A | | 4/2003 | | |
| JP | 2006-296179 A | | 10/2006 | | |
| WO | WO 2007148745 A1 | * | 12/2007 | ................... | 320/116 |

* cited by examiner

METHOD AND DEVICE FOR BALANCING ELECTRICAL VOLTAGES IN ELECTRICAL ACCUMULATOR UNITS

CROSS-REFERENCE TO RELATED APPLICATION

This application is a 35 USC 371 application of PCT/EP 2009/065469 filed on Nov. 19, 2009.

BACKGROUND OF THE INVENTION

Field of the Invention

The invention relates to a method for balancing the electrical voltages of at least two serially connected electrical accumulator units. The invention also relates to a corresponding electrical accumulator.

Description of the Prior Art

It is clear that in future, in both stationary applications, such as wind farms and non-stationary applications, such as in vehicles, for example hybrid and electric vehicles, new battery systems of which very stringent demands for reliability will be made will increasingly come into use. The background of these demands is that a failure of the battery systems can lead to either a failure of an entire system pertaining to the application, or to a safety-relevant problem. One conceivable example of such a failure is an electric vehicle that if its traction battery fails is "dead in the water", since it is no longer capable of propelling itself. As an example of a safety-relevant problem, a wind farm is conceivable, in which electrical accumulators are used for protecting the farm against impermissible modes of operation by adjusting the rotor blades under strong wind conditions. Failure of these electrical accumulators can then lead to safety-relevant problems.

When many individual accumulator units, such as battery cells, connected in series are used, the individual accumulator units are not automatically equal. As a result, particularly over the service life of the accumulator units, this leads to unequal electrical voltages among the individual accumulator units, unless appropriate countermeasures are taken. Especially with lithium-ion batteries, excessive charging or deep discharging of individual accumulator units leads to irreversible damage. Such excessive charging or deep discharging can result when a battery management system regulates a charging or discharging operation based on one of the accumulator units, which is not representative all of the accumulator units. For that reason, balancing of the electrical voltages of the electrical accumulator units among one another must be done at regular intervals. This balancing is known as "cell balancing". To that end, the individual accumulator units are discharged, by external wiring provisions, in such a way that after the balancing, they all have the same electrical voltage.

It is known for that purpose to perform so-called resistance balancing. To that end, an ohmic resistor or a resistor combination is assigned to each accumulator unit via switches. By means of the resistors, the accumulator units are discharged until such time as the accumulator units have the electrical voltage. It is disadvantageous here that energy stored in the electrical accumulator units is converted into heat by the resistors and is carried away unused, for the sake of achieving the desired charge balance. Hence there is a need for a way in which balancing the electrical voltages of a plurality of accumulator units among one another is attained with little energy loss and in which a substantial improvement in the efficiency of a complete electrical accumulator system is brought about.

SUMMARY OF THE INVENTION

According to the invention, it is provided that the one accumulator unit is connected to the winding of a coil for the excitation of that coil, and that next, by means of the excited coil, the other accumulator unit is charged by the connection of the winding to that other accumulator unit. It is provided that the same winding that is used for exciting the coil is also used for charging the other accumulator unit. In this way, it becomes possible for the energy stored in the accumulator units not to be merely converted into heat, but to be transferred from the one accumulator unit to the other, so that the electrical voltages of the various accumulator units are balanced with each other. Charging the other accumulator unit should be understood to mean that the coil is excited, and by means of the electrical energy that is thus available, the other accumulator unit is further charged. Charging should accordingly be understood to mean not full charging of the entire electrical accumulator, but rather transporting an electrical charge between the accumulator units and the coil for the sake of balancing the electrical voltages.

In a further feature of the invention, it is provided that the one accumulator unit, which is connected to the winding of the coil for its excitation, has a higher electrical voltage than the accumulator unit that is charged next, by the connection of the winding.

In a further feature of the invention, it is provided that as the accumulator units, one accumulator cell each, in particular a battery cell, is used.

In a further feature of the invention, it is provided that the coil is charged by closure of a switch. Using the switch makes it possible to charge at least one coil in a targeted manner. In this way, the method can be employed in targeted manner to individual accumulator units, without always having to include all the accumulator units in the method.

In a further feature of the invention, it is provided that the two accumulator units are located adjacent one another. Being located adjacent one another should be understood to mean that the accumulator units are connected directly in series with one another, and a positive pole of one of the accumulator units is connected directly to a negative pole of the other accumulator unit via a line.

In a further feature of the invention, it is provided that each adjacent accumulator unit is assigned a coil. When there is a plurality of adjacent accumulator units, it is provided in particular that each adjacent accumulator unit is assigned its own coil, with a winding.

In a further feature of the invention, it is provided that the coil charges the other accumulator unit by opening the switch. By appropriate interconnection, it becomes possible to end the charging of the coil by opening the switch, and by reinduction, or in other words de-excitation, the coil makes the energy stored in it available. In that case, the coil outputs the stored electrical energy, and that energy is taken up by the other accumulator unit, which is being charged. The combination here of closing the switch to charge the coil and opening the switch to charge the accumulator unit is advantageous, since by means of only two positions of the switch, both the charging of the coil and the charging of the accumulator unit can be brought about in succession in a simple way.

In a further feature of the invention, it is provided that the other accumulator unit is charged by the coil via at least one diode. This is especially advantageous whenever a flow of current, which flows into the coil upon charging, is reversed and flows out of the coil again, for charging the accumulator unit in the reverse manner. Thus the coil can be connected to two accumulator units simultaneously, and the charging of the other accumulator unit depends on whether the coil is being charged or discharged.

The invention relates further to an electrical accumulator having at least two serially connected electrical accumulator units and one electrical balancing circuit, in particular for performing the method described above, in which the balancing circuit has at least one coil having a winding and its winding is connectable to one of the accumulator units for exciting the coil, and in which, for charging the other accumulator unit, the winding can be connected to that accumulator unit.

In a further feature of the invention, it is provided that the balancing circuit has at least one diode and/or at least one switch.

In a further feature of the invention, it is provided that the switch is embodied as a semiconductor switch, in particular a transistor, thyristor, or the like. By the use of semiconductor elements, very easy automation is made possible, by means of electrical components, such as circuits. Moreover, in this way the device of the invention can be embodied in a space-saving way and can be produced economically.

In a further feature of the invention, it is provided that each of the accumulator units has an accumulator cell, in particular a battery cell.

BRIEF DESCRIPTION OF THE DRAWINGS

The drawings illustrate the invention in terms of an exemplary embodiment; in the drawings.

DESCRIPTION OF THE PREFERRED EMBODIMENT

Figure 1:
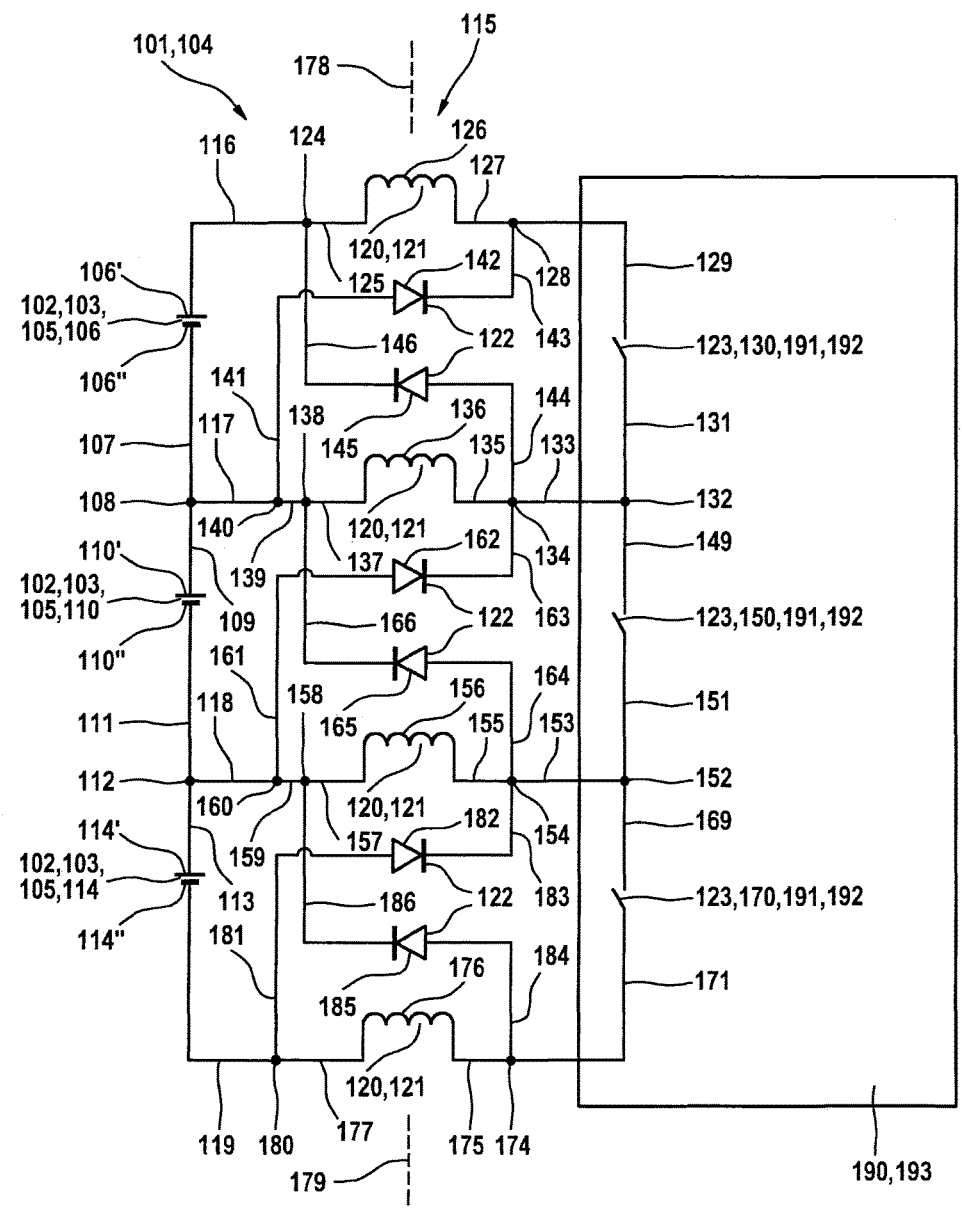
FIG. 1 shows an electric switch with a balancing circuit.

FIG. 1 shows a detail of an electrical accumulator 101, comprising three accumulator units 102 in the form of accumulator cells 103 that are connected in series adjacent to one another. The electrical accumulator 101 is embodied as a battery 104, and the accumulator cells 103 are embodied as battery cells 105. The accumulator units 102 form the electrical accumulator 101 by means of the fact that a first accumulator unit 106 is connected via its negative pole 106" and a line 107 to a node point 108, which leads via a line 109 to a positive pole 110' of a second accumulator unit 110. The second accumulator unit 110 is connected in turn via its negative pole 110" and a line 111 to a node point 112, which leads via a line 113 to a positive pole 114' of a third accumulator unit 114. A balancing circuit 115, a detail of which is shown in FIG. 1, is assigned to the accumulator 101. The balancing circuit 115 is connected via a line 116 to a positive pole 106' of the first accumulator unit 105. It is also connected to the node point 108 via a line 117, to the node point 112 via a line 118, and to a negative pole 114" of the third accumulator unit 114 via a line 119. The balancing circuit 115 has a plurality of electric coils 121, each with a winding 120. The balancing circuit 115 furthermore has diodes 122 and switches 123. The line 116 is connected via a node point 124 to a further line 125, which leads to a first winding 126. The first winding 126 is connected via a line 127 to a node point 128, which has a further line 129 which leads to a first switch 130. Beginning at the first switch 130, a line 131 leads to a node point 132. From the node point 132, a line 133 leads to a further node point 134, which in turn is connected via a line 135 to a second winding 136. The second winding 136 is connected via a line 137 to a node point 138, which is connected via a line 139 to a further node point 140. The node point 140 is also connected to the line 117. Via a line 141, a first diode 142 is connected to the node point 140. The diode 142 is also connected to the node point 128 via a line 143. The diode 142 is disposed between the lines 141 and 143 in such a way that it has a conducting direction from the line 141 to the line 143. The node point 134 is connected via a line 144 to a second diode 145, which in turn is connected via a line 146 to the node point 124. The second diode 145 has a conducting direction from the line 144 to the line 146. Beginning at the node point 132, a further line 149 leads to a second switch 150. From the switch 150, a line 151 leads to a node point 152. From the node point 152, a line 153 leads to a further node point 154, which in turn is connected via a line 155 to a third winding 156. The winding 156 is connected via a line 157 to a node point 158, which is connected via a line 159 to a further node point 160. The node point 160 is also connected to the line 118. Via a line 161, a third diode 162 is connected to the node point 160. The diode 162 is also connected to the node point 134 via a line 163. The diode 162 is disposed between the lines 161 and 163 in such a way that it has a conducting direction from the line 161 to the line 163. The node point 154 is connected via a line 164 to a fourth diode 165, which in turn is connected via a line 166 to the node point 138. The fourth diode 165 has a conducting direction from the line 164 to the line 166. Beginning at the node point 152, a further line 169 leads to a third switch 170. Beginning at the switch 170, a line 171 leads to a node point 174. The node point 174 is in turn connected via a line 175 to a fourth winding 176. The winding 176 is connected via a line 177 to a node point 180. The node point 180 is also connected to the line 119. Via a line 181, a fifth diode 182 is connected to the node point 180. The diode 182 is also connected to the node point 154 via a line 183. The diode 182 is disposed between the lines 181 and 183 in such a way that it has a conducting direction from the line 181 to the line 183. The node point 174 is connected via a line 184 to a sixth diode 185, which in turn is connected to the node point 158 via a line 186. The sixth diode 185 has a conducting direction from the line 184 to the line 186. The switches 123 are assigned to an electronic control unit 190. For that purpose, they are embodied as semiconductor switches 191 in the form of transistors 192, so that the control unit 190 forms an integrated circuit 193. Dashed lines 179 indicate that both the electrical accumulator 101 and the balancing circuit 115 are continued logically onward in the direction of the lines 179.

Figure 2:
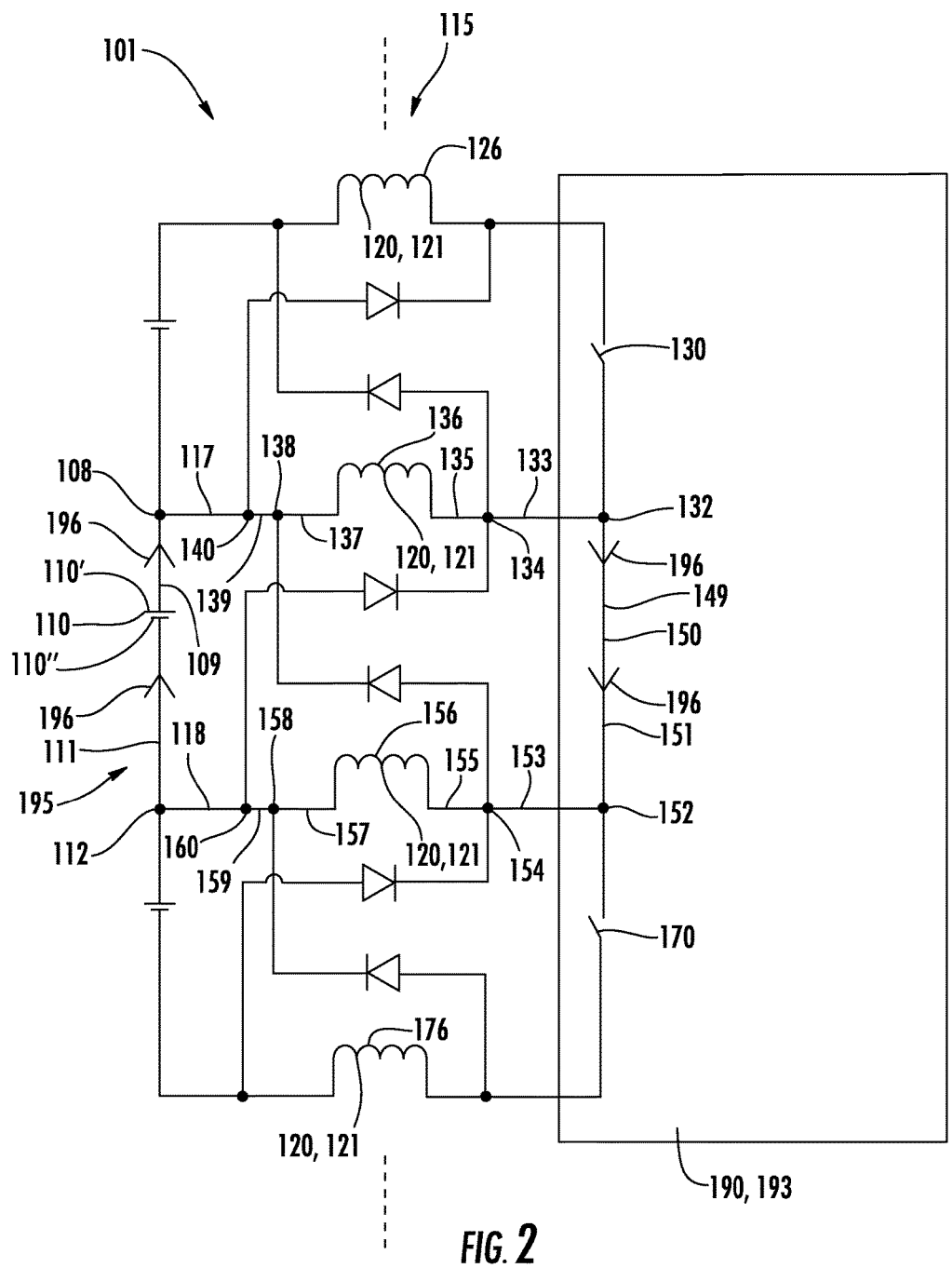
FIG. 2 shows the accumulator with the balancing circuit of FIG. 1 in a first method step.

FIG. 2 shows the electrical accumulator 101 and the balancing circuit 115 of FIG. 1 with all their features. Unlike in FIG. 1, in FIG. 2 the second switch 150 is closed, for performing a first method step. The accumulator unit 110 furthermore has a higher voltage than the other accumulator units 106 and 114. As a result, there is a closed electric circuit 195 for the second accumulator unit 110, the second winding 136 and the third winding 156. The electric circuit 195 in FIG. 2 is shown in heavy lines and is provided with current direction arrows 196. The electric circuit 195 extends from the positive pole 110' of the second accumulator unit 110 via the line 109 and onward via the line 117 to the node point 140, so that by means of the lines 137 and 139, the coil 121 of the second winding 136 is charged. The electric circuit 195 also extends via the lines 135, 133 and 149 to the closed second switch 150. It continues via the lines 151, 153 and 154 to the third winding 156. Beginning at the third winding 156, the electric circuit 195 is closed via the lines 157, 159, 118 and 111 to the negative pole 110" of the second accumulator unit 110. By means of this closed electric circuit 195, a charge is transferred into the second and third windings 136 and 156 and stored there. The closure of the second switch 150 is effected by the control unit 190. It is provided that each accumulator unit 102 charges two windings 120. By closure of the switch 150, the electric circuit 195 is closed, and it is opened again either after a certain period of time or after a certain level of the current that flows through the switch is reached.

Figure 3:
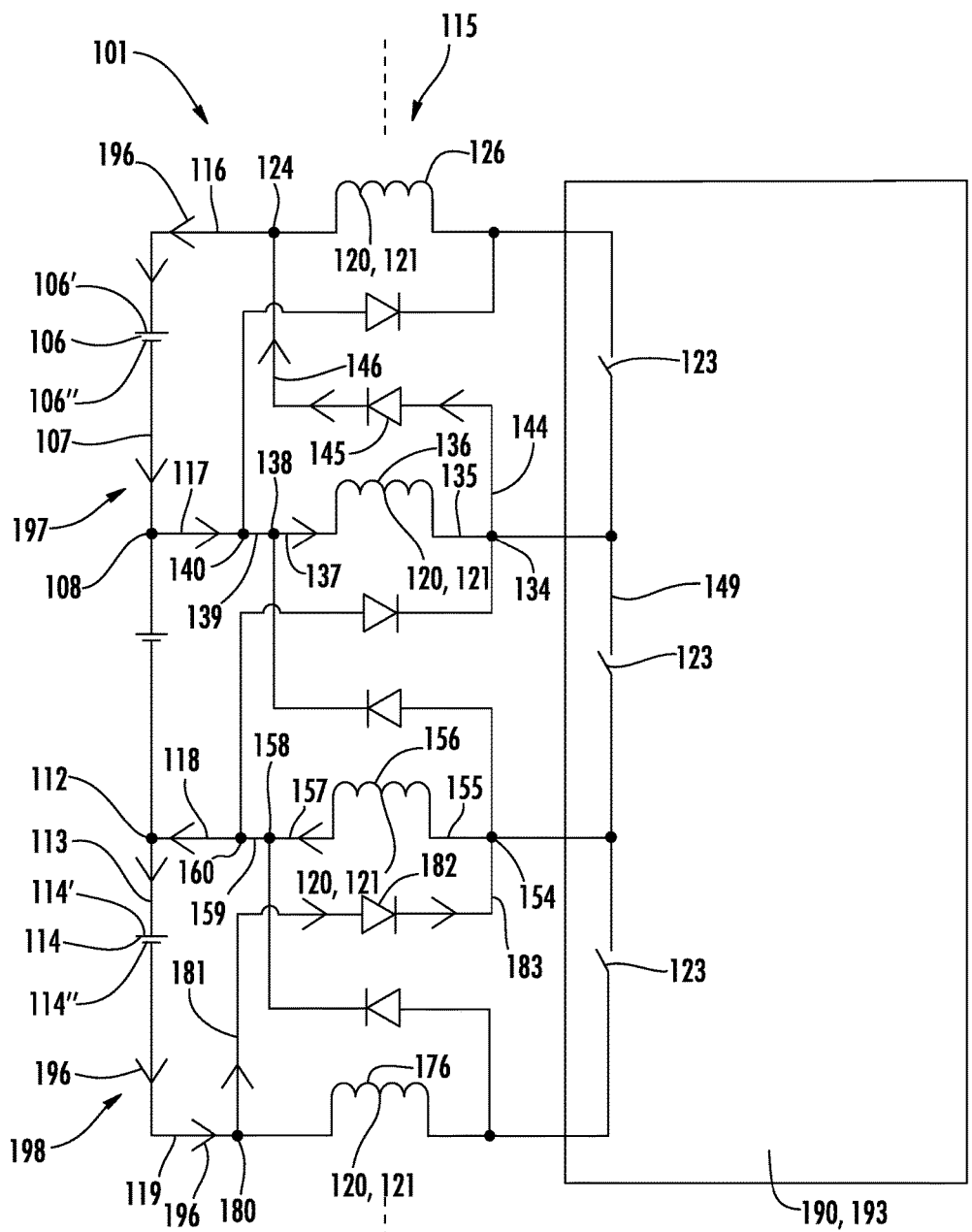
FIG. 3 shows the accumulator with the balancing circuit of FIG. 1 in a second method step.

FIG. 3 shows the accumulator 101 and the balancing circuit 115 of FIG. 1 with all their features. The switches 123 are all opened for a second method step, and the coils assigned to the second winding 136 and the third winding 156 are excited. The result is two electric circuits 197 and 198; the electric circuit 197 is assigned to the first accumulator unit 106, and the second electric circuit 198 is assigned to the third accumulator unit 114. The electric circuit 197 extends from the second winding 136 to the second diode 145, via the lines 135 and 144. Beginning at the second diode 145, the electric circuit 197 extends onward via the lines 146 and 116 into the positive pole 106' of the first accumulator unit 106. From the negative pole 106" of the accumulator unit 106, the electric circuit 197 extends via the lines 107, 117, 139 and 138 back to the second winding 136. The electric circuit 198 begins at the third winding 156, which is connected via the lines 157, 159, 118 and 113 to the positive pole 114' of the third accumulator unit 114. From the negative pole 114" of the third accumulator unit 114, the fifth diode 182 is connected via the lines 119 and 181, so that beginning at the diode 182, the electric circuit 198 is closed via the lines 183 and 155. Within the electric circuits 197 and 198, the various current directions are represented by current direction arrows 196. The current directions run in the directions that correspond to the conducting directions of the second diode 145 and the fifth diode 182. Via the electric circuits 197 and 198, the coils of the windings 136 and 156 can be de-excited; that is, they give up their charges, which flow into the corresponding accumulator units 106 and 114 and as a result further charge those accumulator units. For that purpose it is unnecessary to employ further control means for the second method step, since this process ensues automatically because of the balancing circuit shown.

The method steps shown in FIGS. 2 and 3 describe the possibility of charging the first accumulator unit 106 and the second accumulator unit 114 with an electrical charge from the second accumulator unit 110. This process is highly energy-efficient, since electrical charges are transferred among the accumulator units.

The foregoing relates to the preferred exemplary embodiment of the invention, it being understood that other variants and embodiments thereof are possible within the spirit and scope of the invention, the latter being defined by the appended claims.

The invention claimed is:

1. A charge balancing circuit comprising:
a first accumulator having a first pole and a second pole of the first accumulator;
a second accumulator having a first pole and a second pole of the second accumulator, the first pole being directly connected in series to the second pole of the first accumulator;
a third accumulator having a first pole and a second pole of the third accumulator, the first pole being directly connected in series to the second pole of the second accumulator;
a first switch having a first terminal and a second terminal of the first switch;
a second switch having a first terminal and a second terminal of the second switch;
a first charging coil having a first terminal and a second terminal of the first charging coil, the first terminal of the first charging coil being directly connected to (i) the second pole of the first accumulator and (ii) the first pole of the second accumulator and the second terminal of the first charging coil being directly connected to (i) the first terminal of the first switch and (ii) the second terminal of the second switch;
a second charging coil having a first terminal and a second terminal of the second charging coil, the first terminal of the second charging coil being directly connected to (i) the second pole of the second accumulator and (ii) the first pole of the third accumulator and the second terminal of the second charging coil being directly connected to the second terminal of the first switch;
a third charging coil having a first terminal and a second terminal of the third charging coil, the first terminal of the third charging coil being directly connected to the first pole of the first accumulator and the second terminal of the third charging coil being directly connected to the first terminal of the second switch;
a first diode having an anode directly connected to the second terminal of the first charging coil and a cathode directly connected the first pole of the first accumulator;
a second diode having an anode directly connected to the second pole of the third accumulator and a cathode directly connected the second terminal of the second charging coil; and
a controller operatively directly connected to the first switch, the controller being configured to:
close the first switch to discharge the second accumulator with the second accumulator producing a first electric current to flow from the second pole of the second accumulator through the first charging coil, the first switch, and the second charging coil to the first pole of the second accumulator; and
open the first switch to produce concurrent second and third electric currents to charge the first accumulator and third accumulator, respectively, the third current flowing in a portion of the circuit from the first terminal of the second charging coil through the first pole of the third accumulator and the second pole of the third accumulator through the anode and the cathode of the second diode to the second terminal of the second charging coil in response to the first switch being open.

2. The circuit of claim 1, wherein the second current flows in a portion of the circuit from the second terminal of the first charging coil through the anode and cathode of the first diode to the first pole of the first accumulator and from the second pole of the first accumulator to the first terminal of the first charging coil in response to the first switch being open.

3. The circuit of claim 1, wherein substantially no electric current flows through the first diode and the second diode during operation of the circuit with the first switch closed.

4. The circuit of claim 1, the controller being further configured to:
   measure a level of the first electric current with the first switch being closed; and
   open the first switch in response to the level of the first electric current exceeding a predetermined threshold.

\* \* \* \* \*